(12) United States Patent
Schneider et al.

(10) Patent No.: US 10,178,778 B2
(45) Date of Patent: Jan. 8, 2019

(54) TRANSFERABLE FILM INCLUDING READABLE CONDUCTIVE IMAGE, AND METHODS FOR PROVIDING TRANSFERABLE FILM

(71) Applicant: ILLINOIS TOOL WORKS, INC, Glenview, IL (US)

(72) Inventors: John H. Schneider, Frankfort, IL (US); William A. Herring, Valparaiso, IN (US)

(73) Assignee: Illinois Tool Works Inc., Glenview, IL (US)

( * ) Notice: Subject to any disclaimer, the term of this patent is extended or adjusted under 35 U.S.C. 154(b) by 1116 days.

(21) Appl. No.: 13/839,444

(22) Filed: Mar. 15, 2013

(65) Prior Publication Data
US 2014/0261961 A1    Sep. 18, 2014

(51) Int. Cl.
*H05K 3/30*    (2006.01)
*B32B 33/00*    (2006.01)
*B32B 37/26*    (2006.01)
*H05K 1/02*    (2006.01)

(52) U.S. Cl.
CPC ............. *H05K 3/305* (2013.01); *B32B 33/00* (2013.01); *B32B 2037/268* (2013.01); *B32B 2367/00* (2013.01); *H05K 1/0269* (2013.01); *H05K 2201/09927* (2013.01); *H05K 2201/09936* (2013.01); *Y02P 70/613* (2015.11); *Y10T 156/10* (2015.01); *Y10T 428/2486* (2015.01); *Y10T 428/24843* (2015.01); *Y10T 428/24851* (2015.01)

(58) Field of Classification Search
CPC ................. B32B 37/025; B32B 33/00; G06K 19/07749; H05K 3/305
USPC ................................ 156/247; 235/488, 492
See application file for complete search history.

(56) References Cited

U.S. PATENT DOCUMENTS

| | | |
|---|---|---|
| 5,638,080 A | 6/1997 | Orthmann et al. |
| 7,289,066 B2 | 10/2007 | Homolle et al. |
| 7,834,818 B2 | 11/2010 | Seemann et al. |
| 8,077,114 B2 | 12/2011 | Lehnberger et al. |
| 8,350,768 B2 | 1/2013 | Peters |
| 2001/0018796 A1 | 9/2001 | Lee et al. |
| 2006/0053286 A1 | 3/2006 | Schaengold |

(Continued)

FOREIGN PATENT DOCUMENTS

| | | |
|---|---|---|
| DE | 4345473 | 3/2006 |
| EP | 1179811 | 2/2002 |

(Continued)

*Primary Examiner* — Philip C Tucker
*Assistant Examiner* — John Blades
(74) *Attorney, Agent, or Firm* — Joseph F. Harding; The Small Patent Law Group LLC (57) ABSTRACT

A transferable film includes a carrier layer and an intermediate film portion. The carrier layer is configured to receive one or more additional layers and to be releasable from the one or more additional layers temporally proximate to an application of the transferable film to an object. The intermediate film portion includes a readable conductive image portion and is configured for application thereto of an adhesive layer. The intermediate film portion is configured to be interposed between the carrier layer and the adhesive layer, and the adhesive layer configured to adhere to the object for the application of the transferable film to the object.

15 Claims, 4 Drawing Sheets

(56) References Cited

U.S. PATENT DOCUMENTS

| | | |
|---|---|---|
| 2008/0120835 A1 | 5/2008 | Caletka et al. |
| 2008/0259416 A1 | 10/2008 | Peters et al. |
| 2009/0128445 A1 | 5/2009 | Seemann et al. |
| 2009/0267741 A1* | 10/2009 | Li et al. .................. 340/10.1 |
| 2010/0018640 A1* | 1/2010 | Simons .................... 156/235 |
| 2010/0328922 A1* | 12/2010 | Peters et al. ............. 361/816 |
| 2013/0194192 A1* | 8/2013 | Andolina .................. 345/173 |

FOREIGN PATENT DOCUMENTS

| | | | | |
|---|---|---|---|---|
| EP | 1365451 | | 11/2003 | |
| EP | 1748382 | | 1/2007 | |
| JP | 01-098291 | * | 4/1989 | ............... H05K 3/20 |
| WO | WO 03077620 | | 9/2003 | |
| WO | WO 2006061171 | | 6/2006 | |

* cited by examiner

TRANSFERABLE FILM INCLUDING READABLE CONDUCTIVE IMAGE, AND METHODS FOR PROVIDING TRANSFERABLE FILM

BACKGROUND

The subject matter described herein generally relates to transferable films and systems and methods for providing transferable films.

BRIEF SUMMARY

One or more embodiments described herein provide for a transferable film (and/or method for providing the same) that includes a readable conductive image. For example, embodiments provide a heat transferable film with an integrated circuit embedded, incorporated, or otherwise contained therein.

BRIEF DESCRIPTION OF THE DRAWINGS

The present inventive subject matter will be better understood from reading the following description of non-limiting embodiments, with reference to the attached drawings, wherein below.

DETAILED DESCRIPTION

In accordance with one or more embodiments described herein, a transferable film including a readable conductive image and methods for providing and/or applying a transferable film including a readable conductive image are disclosed. For example, the transferable film may be configured as a heat transferable film having a carrier layer, a readable conductive image portion, and an adhesive layer. The carrier layer may be heat releasable and removed when the film is applied to an object, such as a box, envelope, package, product, or the like. In some embodiments, the transferable film is configured as a heat transferable film (e.g., configured to be applied via a combination of heat, time, and pressure, which may be facilitated via a press and/or roller, or the like). In some embodiments, the transferable film is configured as a hot stamped foil for application to an object via a hot stamping process utilizing a die. The readable conductive image portion in various embodiments may be configured to correspond to identification information of the film or an object to which the film is configured to be attached or affixed.

A readable conductive image as used herein may be understood as an image, number, alphanumeric code, representation, or the like that may be communicated via detection of one or more electrical signals via a direct or indirect physical contact. For example, a readable conductive image may be read via a direct contact between a device configured to read the image and the image. As another example, a readable conductive image may be read via an indirect contact between a device configured to read the image and the image, where the device and the image are both in contact with an intermediary member or group of intermediary members, such as one or more layers of a transferable film including the readable conductive image that is interposed between the device and the image. In various embodiments, a readable conductive image embedded within or otherwise incorporated into a transferable film may include information for identifying and/or tracking a package or product to which the transferable film has been attached. Thus, transferable films provided by various embodiments may be utilized, for example, as labels for products or product packaging providing for identification and tracking of products or packaging through various stages of manufacture, warehousing, distribution, sale, delivery, or the like; labels for packages to be shipped allowing for identification and tracking of packages being shipped; or the like.

In various embodiments, the readable conductive image portion may be included, configured to correspond with, or otherwise associated with other layers of a transferable film. For example, a graphics layer may be included as a part of a transferable film. The graphics layer may be positioned above (e.g., positioned more closely to an observer of the transferable film or farther from an object to which the transferable film has been applied or is configured to be applied) than readable conductive image portion, and the graphics layer may be substantially opaque, so that the graphics layer blocks, obscures, or conceals the readable conductive image portion from view. Thus, the readable conductive image portion may not be visible to an observer. Further still, a readable conductive image may correspond to an above-positioned portion of a graphics layer. For example, a portion of a graphics layer may be interposed between an observer and the readable conductive image along the line of sight of an observer. The observer may place a capacitive reader against the graphics portion, which positions the capacitive reader to read the readable conductive image corresponding to the graphics portion. In various embodiments, the graphics portion may provide a visual cue to a viewer (e.g., an icon, a number, a symbol or the like) identifying or indicating a position or location for placement of a reader for reading a readable conductive image.

The readable conductive image may be read, for example, via direct or indirect contact with a capacitive reader, such as a touch screen (e.g., a touch screen of a smart phone). Layers positioned above the readable conductive layer (e.g., layers interposed between a readable conductive image and a reader configured to read the readable conductive image) may be configured to allow reading of the readable conductive layer through the above-positioned layers by a capacitive reader. For example, above positioned layers may have a thickness configured to allow a readable conductive layer positioned therebeneath to be read. A readable conductive image in various embodiments may be contacted directly by a capacitive reader. A readable conductive image in various embodiments may be contacted indirectly by a capacitive reader when the capacitive reader contacts a layer (such as a top coat or a graphics layer) that in turn contacts the readable conductive image either directly or indirectly. Thus, in various embodiments, the readable conductive image may be read (e.g., by a capacitive reader) through one or more above-positioned layers via contact with one of the one or more above positioned layers.

Use of a readable conductive image for identification purposes provides just one example of potential types of readable conductive images or uses for readable conductive images embedded within a transferable film. Alternatively or additionally, other uses of readable conductive images may be employed. Embodiments provide for cost effective mounting of a readable conductive image to a package or product. Embodiments provide for flexibility, functionality, and/or performance of transferable films by the addition, incorporation, or embedment of a readable conductive image to the transferable film. For example, embodiments provide for a label that may be heat transferable to a package or product that provides for improved readability or other acquisition of identification information. Identification information may be acquired more conveniently, more reliably, or the like. For example, embodiments provide for the reading of identification information with a readily available reader that may be used for many other purposes as well, such as an appropriately configured smartphone with a capacitive touch screen, and eliminate or reduce the need for more expensive and/or specialized reading equipment, such as a radiofrequency identification (RFID) gun. Additionally or alternatively, various embodiments provide for additional functionality for such a transferable film including a readable conductive image. For example, in addition (or alternatively) to obtaining a serial number or other identifier, a contact between a reader (e.g., touch screen of a smartphone) and a readable conductive image may provide descriptive information, direct the contacting smartphone to a corresponding website, enter a phone number into and/or initiate a call by a contacting smartphone, or the like. Embodiments also provide effective visual concealment of a readable conductive image disposed within a transferable film, for example via the use of a graphics layer disposed above the readable conductive image. Various embodiments may provide for convenient mounting of a readable conductive image to products, packages, or surfaces thereof having round, curved, angled, uneven, irregular, or otherwise contoured portions.

Figure 1:
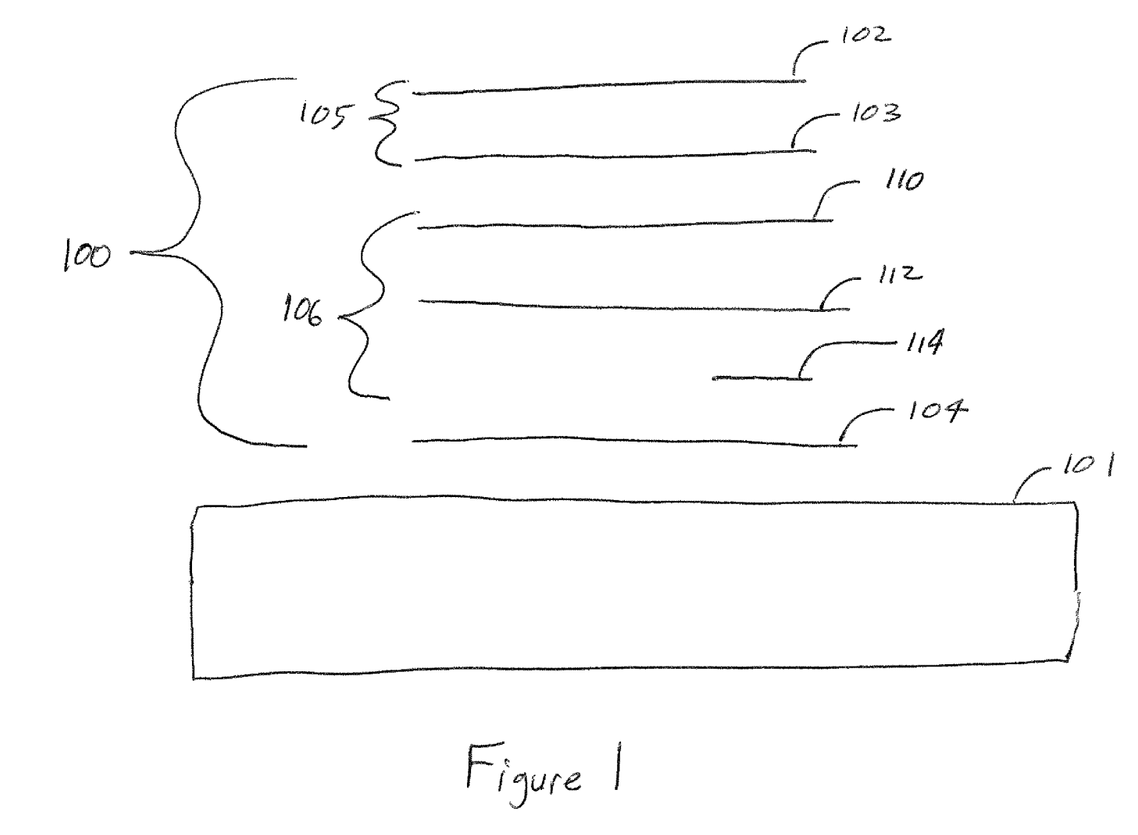
FIG. 1 is a schematic view of one embodiment of a transferable film.
Figure 2:
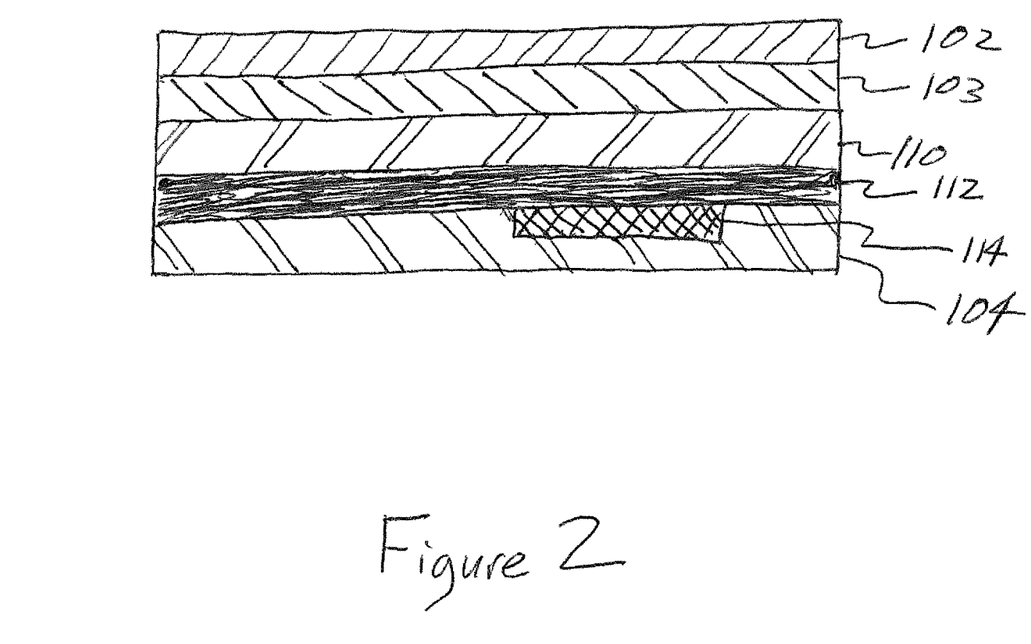
FIG. 2 is a sectional view of a transferable film in accordance with an embodiment.

FIG. 1 shows a schematic view of a plurality of layers that may be combined to form a transferable film 100 that may be applied to an object 101, with the layers depicted in a separated arrangement. FIG. 2 shows a sectional view of the layers in an assembled arrangement. Generally, in the depicted embodiment, the transferable film 100 includes a carrier layer 102, an adhesive layer 104, and an intermediate film portion 106 interposed between the carrier layer 102 and the adhesive layer 104. The transferable film 100 may be configured to be heat transferable by a heat transfer film or by a hot stamp foil process. The carrier layer 102 is configured to be releasable from the transferable film 100 upon application of the transferable film 100 to a target object, such as a box, package, envelope, container, sheet, or the like. The adhesive layer 104 is configured to be oriented toward an object receiving the transferable film 100 and to be positioned adjacent to the object after application of the transferable film 100. The adhesive layer 104 is configured to adhere the intermediate film portion 106 to the object receiving the transferable film 100. The depicted intermediate film portion 106 includes a readable conductive image portion 114 containing a readable conductive image. In the embodiment depicted in FIG. 1, the transferable film 100 also includes a graphics layer 112. Upon, during, or after application of the transferable film 100 to a desired target object, the carrier layer 102 may be released or removed from the transferable film, leaving the adhesive layer 104 and the intermediate film portion 106 adhered or otherwise joined to the object, with an outermost portion or layer of the intermediate film portion 106 defining an exterior boundary of the transferable film 100 after application of the transferable film 100 to an object and removal of the carrier layer 102. The transferable film 100 may be configured to be flexible, and may be mounted to products, packages, or surfaces thereof having round, curved, angled, uneven, irregular, or otherwise contoured portions.

It should be noted that FIG. 1 (or other Figures described herein) is not intended as a scale representation. Instead, FIG. 1 and other Figures described herein are intended as schematic in nature and for clarity of understanding of general principles of various embodiments. For example, layers may vary in thickness or number, different layers may have different thicknesses than other layers, one or more layers may include sub-layers, one or more layers may be combined, one or more layers may be split into separate layers, or the like. Further, various layers may provide differing areas of coverage. For example, a given layer may not cover an entire area covered by a different layer. In some embodiments, one or more layers may be disposed at a same or similar depth in the transferable film, such that given layers may have partially or completely overlapping depths along the thickness of the transferable film 100. Further still, in various embodiments, certain layers depicted in FIG. 1 may not be included, and/or additional layers or sub-layers may be provided.

In the illustrated embodiment, the transferable film 100 includes the carrier layer 102, a release coat 103, a top coat layer 110, a graphics layer 112, and a readable conductive image portion 114. Generally, the top coat layer 110 is configured to provide protection to layers and/or components positioned beneath (e.g., closer to the object 101 when the transferable film 100 is applied to the object 101) the top coat layer 110. The graphics layer 112 may be configured to provide an informative and/or decorative display, and/or to conceal the readable conductive image portion 114 from view. The readable conductive image portion 114 includes a readable conductive image configured to provide a desired communicative functionality to the transferable film 100. For example, the readable conductive image portion 114 may provide identification information regarding the transferable film 100 or an object to which the transferable film 100 is applied. The adhesive layer 104 may be configured to secure, affix, or otherwise adhere the transferable film 100 to the object 101.

The carrier layer 102 may be configured to receive one or more additional layers, directly or indirectly. In the illustrated embodiment, the carrier layer 102 is configured to be releasable from the one or more additional layers temporally proximate to an application of the transferable film to an object. Thus, the transferable film 100 may be considered as being transferred from the carrier layer 102 to the object 101. Temporally proximate may be understood as meaning, for example, at or near in time. For example, the release of the carrier layer 102 may overlap in time with the application of the transferable film 100 to an object, or as another example, may occur shortly thereafter. The carrier layer 102 is configured to provide a substrate for construction of the transferable film 100, with additional layers or sublayers affixed to the carrier layer 102, and/or to a layer or sub-layer that has already been affixed to the carrier layer 102. The carrier layer 102 may be configured as a film. The carrier layer 102 may be made from, for example, a polymeric film. For example, a polyethylene terapththalate (PET) such as biaxially-oriented polyethylene terephthalate (BoPET) may be used. BoPET may be understood as a polyester film made from stretched PET.

The release layer 103, in the embodiment depicted in FIG. 1, is disposed immediately beneath (e.g., closer to the intermediate film portion and/or to an object to which the transferable film 100 is to be affixed) the carrier layer 102. Thus, in the illustrated embodiment, the release coat 103 is interposed between the carrier layer 102 and all or a portion of the readable conductive image portion 114. The release coat 103 of the illustrated embodiment is configured to facilitate the release of the carrier layer 102 from the transferable film 100 under specific conditions (e.g., a specified application of heat, for example a given amount of heat and/or duration of time of heat application). In various embodiments, the release coat 103 may form a releaseable assembly 105 with the carrier layer 102, with the release coat 103 being released or removed from the transferable film 100 with the carrier layer 102 after the transferable film 100 has been applied to an object (e.g., object 101). In various embodiments, the release coat 103, for example, may be sprayed or coated onto a surface of the carrier layer 102 (e.g., the bottom surface of the carrier layer 102 in the sense of FIG. 1). The release coat 103, for example, may be made from an acrylic or other polymer.

The top coat layer 110 in the illustrated embodiment is the portion of the intermediate film portion 106 that is positioned immediately adjacent to the release coat 103. In embodiments without a release coat 103, the top coat layer 110 may be positioned adjacent the carrier layer 102. In the illustrated embodiment, the top coat layer 110 is indirectly applied to the carrier layer 102 by being applied to the release coat 103 which is in turn affixed to the carrier layer 102. Thus, the top coat layer 110 of the depicted embodiment is configured to be the outermost portion (e.g., closest to an observer or farthest from the object to which the transferable film 100 is affixed) of the transferable film 100 after application to the object 101 and removal of the carrier layer 102. In some embodiments, for example certain embodiments including a graphics layer 112, the top coat layer 110 may be substantially transparent to minimize or reduce any effect the top coat layer 112 may have on the visual appearance of the graphics layer 112. In other embodiments, for example certain embodiments that do not have a graphics layer 112, the top coat layer 110 may be configured to be partially or entirely opaque to help shield the readable conductive image portion 114 from view. Generally, the top coat layer 110 is configured to provide protection from exposure to other aspects of the intermediate film portion 106. In various embodiments, such as the embodiment depicted in FIG. 1, a release coat layer (e.g., release coat 103) may be interposed between the carrier layer 102 and the top coat layer 110. In some embodiments, the top coat layer 110 may have release properties to assist in the removal of the carrier layer 102 from the top coat layer 110. In alternate embodiments, the top coat layer 110 may also be releasable and/or be part of the carrier layer 102. In still other embodiments, the top coat layer 110 may not be present.

The graphics layer 112 in the illustrated embodiment is positioned beneath (e.g., closer to the object 101 and farther from an observer) the top coat layer 110. The graphics layer 112 may include one or more of a logo, a title, a slogan, a product name, a part number, a border, or the like configured to be displayed to an observer of the transferable film 100 (e.g., an observer of an object to which the transferable film 100 has been applied). The graphics layer 112 may be configured to provide a decorative and/or an informative display to an observer, while in other embodiments the graphics layer 112 may be composed of a solid color, which may, for example, act to visually shield (but not conductively shield) a readable conductive image from display and/or provide a visual cue or indication regarding the location of the readable conductive image (e.g., an observer may use all or a portion of the graphics layer 112 as a target for placement of a reader, such as a touch screen). Examples of decorative displays include one or more of a pattern, picture, design, or the like. Examples of informative displays include one or more of a name, title, number, other alphanumeric code, or the like. In various embodiments, the graphics layer 112 may be sized to accommodate available smart phones. For example, a field of a printed graphic or pattern against which a capacitive reader is to be placed may be configured to be small enough to be placed against the screen of conventionally available smart phones.

The information provided by the informative display may be the same as and/or correspond to information provided by the readable conductive image portion 114. For example, a serial number displayed by the graphics layer 112 may correspond to a serial number readable by contacting a capacitive reader (directly or indirectly) to a corresponding portion of the readable conductive image portion 114. In other embodiments, information provided by the graphics layer may be different than and/or not correspond to information provided by the readable conductive image portion 114. Information provided by a graphics layer and a readable conductive image portion may be related. For example, a graphics layer may display a model name and/or pictorial representation corresponding to the object 101, while the optically readable information layer may include a serial number, tracking number, or other identifier of the object 101. The above examples are provided by way of illustration only and not limitation, as other arrangements may be employed. Further still, in some embodiments, the readable conductive image portion 114 and the graphics layer 112 may be incorporated into a common layer or sub-layers, for example, where a readable conductive image portion 114 is positioned adjacent to, instead of beneath, a graphics layer 112.

The graphics layer 112, for example, may be printed. In some embodiments, the graphics layer 112 may be printed on one or more of a carrier layer or a release coat but remain with one or more additional layers such as an adhesive layer after application of the transferable film 100 to the object 101 and removal of the carrier layer and/or release coat (e.g., release of the carrier layer via heating). Alternatively or additionally, the graphics layer 112 may be printed on a top coat layer. In various embodiments, the graphics layer 112 may include sub-layers or be applied sequentially and/or as more than one layer. Various sub-layers of a graphics layer 112 may be arranged side by side, overlapping partially along the depth of the transferable film 100, or on top of each other (e.g., an upper layer may include a transparent window or portion, a translucent portion, or the like allowing all or a portion of a lower level to be seen).

With the graphics layer 112 positioned above the readable conductive image portion (e.g., farther away from the object 101 or closer to an observer), the graphics layer 112 may act to obscure or conceal the readable conductive image portion from view of an observer. Alternatively or additionally, the graphics layer 112 may include one or more portions that correspond to one or portions of a readable conductive image layer or portion, with the corresponding portions of the graphics layer 112 providing a target for contact with a reader configure to read or otherwise communicate with the readable conductive image portion 114. The graphics layer 112, in some embodiments may cover substantially the entire area of the top coat 110, carrier layer 102, or release coat 103, while in other embodiments may cover only a portion of one or more above positioned layers. As indicated above, the design and positioning of the graphics layer 112 may be configured to cooperate with the design and the positioning of the readable conductive image portion. In other embodiments, the graphics layer 112 may be sized and positioned so as to not overlap with the readable conductive image portion 114. In various embodiments, the graphics layer may be printed or otherwise applied to the carrier layer or a release coat associated with the carrier layer; to the top coat, or to the top coat along with the optically readable identification layer (see, e.g., FIG. 1); or the like.

In the illustrated embodiment, the readable conductive image portion 114 is shown positioned beneath the graphics layer 112. Thus, as also indicated above, the graphics layer 112 may shield the readable conductive image portion 114 from the vision of an observer and/or provide a target for placement of a reader to read information from a corresponding portion of the readable conductive image portion 114. The readable conductive image portion 114 in the illustrated embodiment may be printed or otherwise applied to the graphics layer 112. Alternatively or additionally, the readable conductive image portion 114 may be printed or otherwise applied to one or more of the top coat layer 110, the release coat 103, or the carrier layer 102. In various embodiments, a conductive image may be digitally printed onto one or more layers of the transferable film 100 using conductive materials. In various embodiments, conductive material may be transferred, for example, to the top coat 110 (and/or other layer(s)) via a thermal transfer printer.

The image provided via the readable conductive image portion 114 (which in various embodiments may be considered as a layer) may be a distinct readable conductive image in the shape of a distinct image (e.g., a visually recognizable shape or pattern), a number, a word or words, other alphanumeric code or representation, bar code (e.g., Universal Product Code (UPC)), quick response (QR) or other matrix or 2-dimensional bar code, or the like. Generally, the image may be configured to provide a readable and/or interpretable image. For example, the readable conductive image may be readable by a capacitive reader such as a touchscreen (e.g., a touchscreen of a smartphone). In some embodiments, a reader, such as a touchscreen, may display the readable conductive image after contact therewith. For example, a touchscreen may contact (directly or indirectly) a readable conductive image, and then display a serial number, phone number, or the like on the touchscreen to an operator or observer.

In other embodiments, an appropriately programmed or otherwise configured reader may display information corresponding to the readable conductive image. For example, a touchscreen may contact (directly or indirectly) a readable conductive image such as a bar code, and then display an alphanumeric serial code or product name corresponding to the bar code to an observer. In still other embodiments, an appropriately programmed or otherwise configured reader may perform a task or action responsive to the readable conductive image. For example, a touchscreen of a smartphone may contact (directly or indirectly) a readable conductive image displaying or corresponding to a telephone number, and initiate a call to that number. As another example, a touchscreen of a smartphone may contact a readable conductive image displaying or corresponding to a web address or web page and initiate opening the corresponding web page with the smartphone. In various embodiments, the readable conductive image may be configured to provide tracking information, shipping information, identification information, or the like, which may be read using a readily available device and/or a device configured to perform a variety of functions or tasks (e.g., a smartphone), reducing or eliminating the need for specialized equipment such as a RFID gun.

In the illustrated embodiment, a single readable conductive image portion 114 is depicted. Such a readable conductive image portion 114 may include a plurality of readable conductive images. Alternatively or additionally, a plurality of readable conductive image portions may be provided in different locations along an above positioned surface such as the graphics layer 112. Thus, a variety of information may be provided by plural readable conductive images. Further, the graphics layer 112 may provide targets, indicators, or cues to an observer for convenient selection of an appropriate conductive image to contact directly or indirectly with a reader, such as the touchscreen of a smartphone. A number of readable conductive images may be positioned beneath corresponding visual cues of the graphics layer 112. Thus, for example, a product or package provided with a transferable film 100 having multiple readable conductive images may provide multiple types of information and/or functionality to one or more parties. For example, one or more readable conductive images may provide a serial number, tracking information, or the like to a distributor, while one or more readable conductive images may help provide (e.g., via a web link or phone number) product information or service information to a customer, consumer, or other user of a product or package to which the transferable film 100 has been applied.

By way of example, a serial number, bar code, or identification icon may be provided on the graphics layer. When the serial number or other identifier is contacted directly or indirectly (e.g., via a contact with a top coat layer) by a reader, a below positioned corresponding readable conductive image may be indirectly contacted, and the reader may acquire identification information such as a serial number from the readable conductive image. Further, the reader may be able to obtain tracking or other information either directly from the readable conductive image or from a database, for example a database accessed via a smartphone used to read the serial number or other identifier. As another example, a transferable film may be applied as a label to a product or package. The label may include a number of icons, numbers, words, images, or other targets, each corresponding to a readable conductive image. For example, a customer service number or icon may provide a target for a user to contact with a touchscreen of the smart phone. When the customer service number or icon is contacted, a customer service phone number may be displayed on the touch screen and/or a phone call with a customer service department or representative may be initiated by the smart phone. As another example, an information icon or image may provide a target for a user to contact with a touchscreen of the smart phone. When the information icon is contacted, a web page providing information regarding the product, instruction sheet, user manual, or the like, may be displayed and/or linked to by the smartphone.

It may be noted that all or a portion of the readable conductive image portion 114 may be formed or applied as one or more layers or sub-layers. In various embodiments, the various layers or sub-layers may be applied sequentially to already present portions of the transferable film 100.

Alternatively or additionally, various layers or sub-layers of the readable conductive image portion 114 may first be joined together to form a sub-assembly which is subsequently added to already present portions of the transferable film 100.

As also indicated above, the readable conductive image portion 114 may be coordinated with or otherwise correspond to another portion of the transferable film 100 and/or a product, package, or the like to which the transferable film 100 is attached. For example, a serial or tracking number of a readable conductive image portion 114 may be read or determined prior to printing or applying the graphics layer 112, with an optically readable number displayed by the graphics layer 114 configured to correspond to the serial or tracking number of the readable conductive image portion.

In the illustrated embodiment, the adhesive layer 104 is the portion of the transferable film 100 positioned most proximately to the object 101 when the transferable film 100 is applied to the object 101. The adhesive layer 104 may be configured to affix, secure, mount, or otherwise adhere the transferable film 100 to an object, and to maintain the transferable film 100 adhered to the object 101 when the carrier layer 102 (along with the release coat 103 in various embodiments) is removed from the transferable film 100. For example, after the transferable film 100 is applied to the object 101, the carrier layer 102 may be removed (e.g., via a heat release mechanism), with the remaining portions of the transferable film 100 remaining affixed to the object 101 directly or indirectly via the adhesive layer 104. Thus, the transferable film 100 may be understood as being transferred from the carrier layer 102 to the object 101.

In some embodiments, the adhesive layer 104 may be added to the transferable film 100 at or about the same time as the other portions of the transferable film 100 are added (e.g. as part of a generally continuous line or process). In some embodiments, an adhesive layer may be added to the transferable film 100 at a different time or location (e.g., a different facility such as a facility of a customer that has acquired the transferable film 100 from a supplier). For example, the adhesive layer 104 (or an additional adhesive layer) may be applied to the transferable film shortly before the transferable film 100 is applied to the object 101.

Thus, a readable conductive image may be provided by various embodiments for convenient transfer to an object. Embodiments provide for the cost effective mounting of a readable conductive image to a package or product. Embodiments provide for improved flexibility, functionality, and/or performance of transferable films by the addition, incorporation, or embedment of a readable conductive image to the transferable film. For example, embodiments provide for a label that may be heat transferable to a package or product that provides for improved readability or other acquisition of identification information. For example, identification information may be acquired more quickly, more reliably, or the like. Various embodiments provide for the use of a readily available device, and/or a device that may perform a variety of additional functions (such as a smart phone) to read or obtain information from a label or other transferable film application that has been applied to a package, product, envelope, container, or the like. Such use of readily available readers may reduce the cost of obtaining a reader, provide additional functionality and/or versatility to a reader, and/or allow additional parties (e.g., customers or consumers) to read information from a transferable film.

Figure 3:
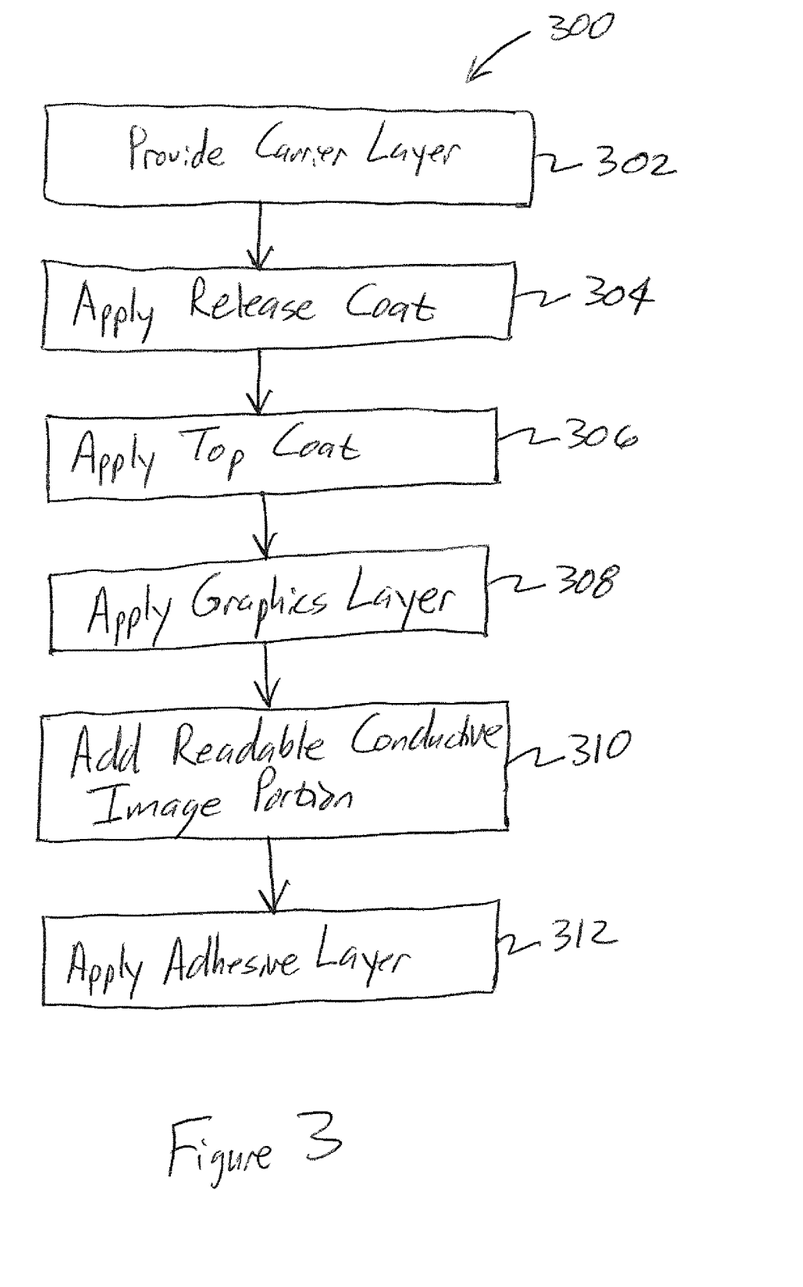
FIG. 3 is a flowchart of one embodiment of a method for providing a transferable film including a readable conductive image in accordance with an embodiment.

FIG. 3 shows a flowchart of a method 300 for providing a transferable film including a readable conductive image. The method 300 may be used in conjunction, for example, with one or more embodiments described herein, and/or used to provide a transferable film such as transferable film 100 shown in FIGS. 1 and 2 and described herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. Generally, the method 300 includes the provision or acquisition of a carrier layer (e.g., carrier layer 102), and the addition thereto of an intermediate film portion (e.g., intermediate film portion 106) and an adhesive layer (e.g., adhesive layer 104). In various embodiments, a portion or layer may be provided in one or more steps (e.g., an intermediate film portion may be added by the application of a plurality of layers or portions applied sequentially). Further, one or more layers or other aspects may be formed into a subassembly and then added to other assemblies or sub-assemblies. By way of example and not limitation, in various embodiments, all or a portion of the intermediate film portion may be formed (e.g., as a foil) as a whole or as a unit before application to a carrier layer or to another layer directly or indirectly joined or affixed to the carrier layer. The transferable film may be formed in one or more locations. For example, in some embodiments, the transferable film may be constructed or assembled in a first location or locations without the adhesive layer configured to be closest to an object receiving the transferable film. Instead, the adhesive layer configured to be closest to the object receiving the transferable film being joined or added to the transferable film at or near the time of application of the transferable film to the object. In various embodiments, certain steps depicted in FIG. 3 (e.g., steps 306-310) may be considered as sub-steps of a step of adding an intermediate film portion to a carrier layer. In some embodiments, various layers may be applied by coating, printing, application as a film or foil, or the like.

At 302, a carrier layer or film (e.g., carrier layer 102) is provided. The carrier layer or film may be constructed, for example, from a polymeric film, such as a PET film or a BoPET film. The carrier layer may be configured to provide a substrate to which additional layers or portions of the transferable film are mounted or affixed directly or indirectly. The carrier layer may also be configured (e.g., with the addition of a release layer and/or a top coat having release properties) to be releaseable or otherwise removable from the transferable film after the transferable film is affixed to an object. For example, the carrier layer may be released from the transferable film as part of a heat transfer through the application of a specific amount of heat and/or duration of heat application.

At 304, a release coat (e.g., release layer 103) may be applied to the carrier layer. For example, the release coat may be coated onto one side of the carrier film (e.g., the side of the carrier film that will be oriented toward an object to which the transferable film is to be applied). The release coat may be configured to have release properties to assist in the release or removal of the carrier film.

At 306, a top coat (e.g., top coat layer 110) is applied or otherwise added to the carrier layer. For example, the top coat may be coated onto the release layer that has been previously applied to the carrier film at 304. The top coat may be configured to protect lower-positioned (e.g., closer to an object to which the transferable film is to be applied or to which the transferable film has been applied) layers or aspects of the transferable film. The top coat may be configured to have release properties to assist in the release or removal of the carrier film. In various embodiments, the top coat may be applied directly to the carrier layer. In other embodiments, the top coat may be applied or added indirectly to the carrier layer, for example, by application to one or more interposed layers such as a release coat or layer.

At 308, a graphics layer (e.g., graphics layer 112) is applied. The graphics layer may be applied in some embodiments directly to the carrier layer and in other embodiments indirectly to the carrier layer via application to one or more layers (e.g., top coat, release layer) that have previously been applied directly or indirectly to the carrier layer. The graphics, for example, may be printed. In some embodiments, the graphics layer may be sized and positioned so that the graphics layer does not laterally overlap with or coat a readable conductive image layer or portion, while in other embodiments the graphics layer may laterally overlap or coat the readable conductive image layer or portion, and may provide a target or other visual cue configured to provide a guide to an operator or user for placement of a reader for reading one or more readable conductive images. The graphics layer may include one or more of graphics (e.g., a picture, pattern, logo, or the like), metal effects, solid colors, or the like. All or a portion of the graphics layer may be substantially opaque so as to visually shield, obscure, or conceal a readable conductive image portion or layer disposed beneath the graphics layer (or portion thereof). In various embodiments, the graphics layer may be composed of layers or sub-layers.

At 310, a readable conductive image portion (e.g., readable conductive image portion 114) is added to the carrier layer, for example, by being affixed or adhered directly to the graphics layer (and thus indirectly to the carrier layer). In various embodiments, the readable conductive image portion (or a portion thereof) may be affixed or adhered directly to one or more other layers or portions such as a carrier layer, a top coat, or a release coat. In some embodiments, the readable conductive image portion may be an assembly or number of subassemblies. The readable conductive image portion may be applied in a single step or may be applied in parts in a series of steps or sub-steps. In various embodiments, the readable conductive image portion may be added by having material (e.g., conductive material) printed or otherwise added to one or more layers of the transferable film in a pre-determined pattern (e.g., image, word, number, code, or the like). The readable conductive image portion may be positioned beneath the graphics layer so that the readable conductive image portion is visually obscured or blocked by the graphics layer applied at 308.

At 312, an adhesive layer (e.g., adhesive layer 104) is applied. The adhesive layer may be applied, for example, by coating a layer of adhesive over the readable conductive image portion applied at 310 and the graphics layer affixed at 308, along with any other surfaces (e.g., carrier layer, top coat, release coat) or portions thereof not previously coated or otherwise covered by a lower-positioned layer. Alternatively or additionally, an additional layer of pigment ink may be coated onto the graphics layer or readable conductive image portion. The adhesive layer is configured to adhere the transferable film to an object, such as a product or package. The adhesive layer, in some embodiments, may be applied at substantially the same time as other layers. In some embodiments, the adhesive layer (or an additional adhesive layer) may be applied at a subsequent time (and may be applied at a different location). For example, the transferable film may be delivered by a manufacturer of the transferable film to a customer or other user, and the customer or other user may apply the adhesive layer (or an additional adhesive layer) at or near the time of application of the transferable film to an object.

Figure 4:
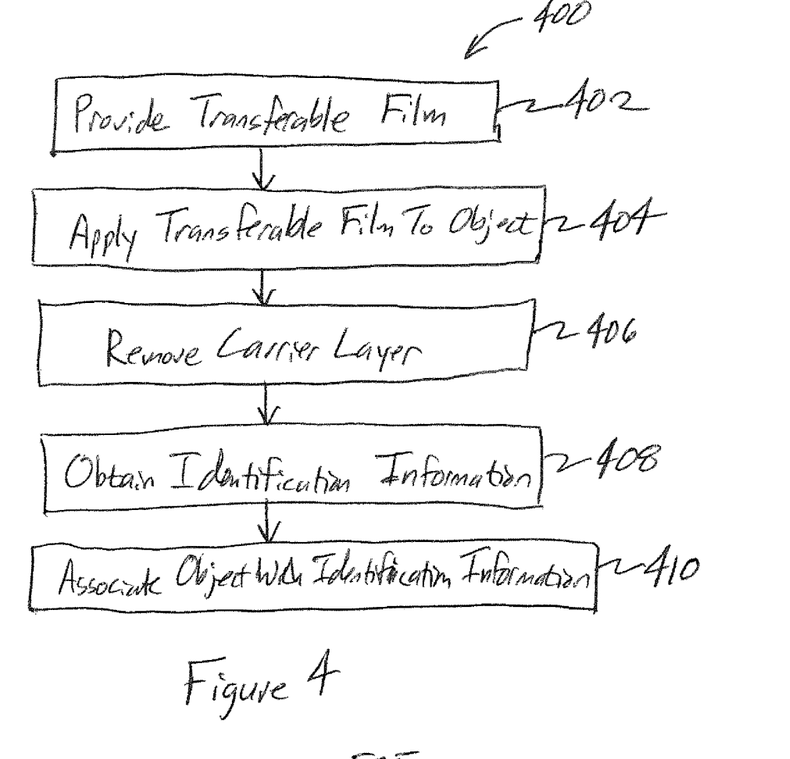
FIG. 4 is a flowchart of one embodiment of a method for transferring a film including a readable conductive image to an object.
Figure 5:
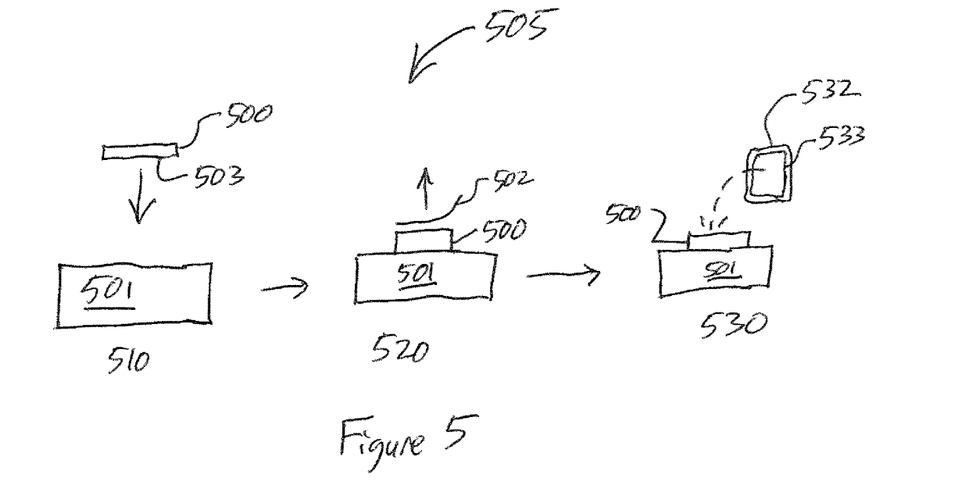
FIG. 5 is a schematic view of an object having a transferable film applied thereto in accordance with an embodiment.

FIG. 4 shows a flowchart of a method 400 for applying a transferable film to an object in accordance with an embodiment, and FIG. 5 provides a schematic depiction of the application of a transferable film 500 to an object 501 in accordance with an embodiment. The method 400 may be used in conjunction with one or more other embodiments (e.g., transferable film 100, method 300) discussed elsewhere herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 402, a transferable film (e.g., transferable film 100) is provided. In some embodiments, the transferable film may be provided with a final adhesive layer incorporated therein or otherwise attached thereto or associated therewith. In certain other embodiments, a transferable film may be provided without a final adhesive layer (e.g., an adhesive layer that will be positioned adjacent to and in contact with an object to which the transferable film will be applied), and the final adhesive layer may be added to or joined with the transferable film at or near the time of application to an object. In FIG. 5, a transferable film 500 at a first stage 510 of a process 505 is depicted schematically in position to be applied to an object 500, with a final adhesive layer positioned at the bottom 503 (in the sense of FIG. 5) of the transferable film 500.

Returning to FIG. 4, at 404, the transferable film is applied to the object. The transferable film includes a readable conductive image portion. The readable conductive image portion in various embodiments may include a readable conductive image configured in an interpretable format (e.g., word, number, barcode or other code, or the like) that may be read by a capacitive reader, such as a touchscreen of a smartphone. The transferable film may be applied to the object in various embodiments via heat. For example, the transferable film may be applied to the object as part of either a heat transfer or hot stamped foil process using a combination of heat, time and pressure to apply the transferable film to the object.

At 406, a carrier layer of the transferable film is removed. The carrier layer may be released or removed from the transferable film as part of a heat facilitated application process. A release coat affixed to or otherwise associated with the carrier layer may be released with the carrier layer in some embodiments. In various embodiments, a transferable film may have a release coat and/or a top coat with release properties positioned proximate the carrier layer to facilitate the release or removal of the carrier layer after the transferable film is applied to an object. The carrier layer (and any layers or portions removed with the carrier layer) may be understood as a temporary portion of the transferable film, as the transferable film may include the carrier layer and be considered as completely formed (e.g., before application of the transferable film to an object), but the transferable film may also not include the carrier layer and be considered as completely formed (e.g., after application of the transferable film to an object and removal of the carrier layer.) Removal of a carrier layer 502 from a transferable film 500 that has been applied to an object 501 is depicted schematically at stage 520 of a process depicted in FIG. 5.

At 408, identification information corresponding to the readable conductive image portion is obtained or acquired. For example, identification information, such as a serial number or other identifier may be read by a capacitive reader. In various embodiments, the identification information may provide general identification information corresponding to a type, style, model, batch, production run, or the like and/or specific identification information corresponding to the particular individual given readable conductive image or object associated with a readable conductive image, such as an object to which the transferable film including the readable conductive image is attached. In FIG. 5, a reader 532 is depicted as being positioned to read a readable conductive image of the transferable film 500 at stage 530. The reader 532, for example, may be configured as a smartphone having a capacitive touchscreen 533 configured to read the conductive readable image when brought into contact (directly or indirectly) with the readable conductive image.

Returning to FIG. 4, at 410, the object to which the transferable film including a readable conductive image has been applied is associated with the readable conductive image (and/or a transferable film that includes the readable conductive image). For example, a serial number, tracking number, or other identifier of the object to which the transferable film has been applied may be retrieved, obtained, or otherwise acquired. The time and date of the transfer of the film may be logged. The time and date of the transfer as well as one or more identifiers (e.g., serial numbers) may be recorded into a database.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While relative dimensions described herein are intended to define the parameters of the inventive subject matter, they are by no means limiting and are example embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. For example, methods (or portions thereof) disclosed herein (e.g., method 300, method 400) may be performed by appropriately programmed computers or processors (e.g., in conjunction with a tangible, non-transitory computer readable medium including one or more software modules configured to direct a processor to perform one or more steps of a method of a given embodiment). Thus, for example, one or more of the functional blocks (for example, processors or memories) may be implemented in a single piece of hardware (for example, a general purpose signal processor, microcontroller, random access memory, hard disk, and the like). Similarly, the programs may be standalone programs, may be incorporated as subroutines in an operating system, may be functions in an installed software package, and the like. The various embodiments are not limited to the arrangements and instrumentality shown in the drawings.

What is claimed is:

1. A method for providing a transferable film, the method comprising:
   providing a carrier layer, the carrier layer configured to be releasable from the transferable film temporally proximate to an application of the transferable film to an object; and
   adding an intermediate film portion to the carrier layer, the intermediate film portion comprising a readable conductive image portion, the readable conductive image portion comprising at least one of a number, a word, or a bar code formed from conductive material, the intermediate film portion configured to receive an adhesive layer, wherein the intermediate film portion is interposed between the carrier layer and the adhesive layer, the adhesive layer configured to adhere to an object during the application of the transferable film to the object, wherein adding the intermediate film portion comprises applying a graphics layer to at least one of the carrier layer or a layer that has previously been applied to the carrier layer, wherein the graphics layer includes one or more portions that correspond to the readable conductive image portion and provide a target for contact with the readable conductive image portion.

2. The method of claim 1, wherein the readable conductive image portion includes a readable conductive image configured to be read via a capacitive reader.

3. The method of claim 1, wherein the readable conductive image portion is configured to be read via a capacitive touch screen.

4. The method of claim 1, wherein the adding an intermediate film portion comprises applying the graphics layer to at least one of the carrier layer or a layer that has previously been applied to the carrier layer, and further comprising applying the readable conductive image portion after the applying the graphics layer, whereby the readable conductive image portion is configured to be positioned beneath the graphics layer relative to an observer of the object when the transferable film is applied to the object, whereby the readable conductive image portion is not visible to the observer.

5. The method of claim 1, further comprising applying a release coat to the carrier layer, the release coat configured to be interposed between the intermediate film portion and the carrier layer.

6. The method of claim 1, wherein the adding the intermediate film portion comprises applying a top coat layer to the carrier layer, the top coat layer configured to protect one or more additional aspects of the intermediate film portion.

7. The method of claim 1, wherein adding the intermediate film portion comprises digitally printing a conductive image of the readable conductive image portion onto one or more layers of the transferable film.

8. The method of claim 1, wherein the readable conductive image portion comprises an image that is configured to be displayed on a screen of a reader configured to contact the transferable film.

9. The method of claim 1, wherein the graphics layer includes a graphically displayed serial number, and wherein the readable conductive image portion comprises a corresponding serial number.

10. A method for providing a transferable film, the method comprising:
   providing a carrier layer, the carrier layer configured to be releasable from the transferable film temporally proximate to an application of the transferable film to an object; and
   adding an intermediate film portion to the carrier layer, the intermediate film portion comprising a readable conductive image portion that comprises at least one of a number, a word, or a bar code formed from conductive material, the intermediate film portion configured to receive an adhesive layer, wherein the intermediate film portion is interposed between the carrier layer and the adhesive layer, the adhesive layer configured to adhere to an object during the application of the transferable film to the object.

11. The method of claim 10, wherein adding the intermediate film portion comprises digitally printing a conductive image of the readable conductive image portion onto one or more layers of the transferable film.

12. The method of claim 10, wherein the visually readable image is configured to be displayed on a screen of a reader configured to contact the transferable film.

13. The method of claim 10, wherein adding the intermediate film portion comprises applying a graphics layer to at least one of the carrier layer or a layer that has previously been applied to the carrier layer, wherein the graphics layer includes one or more portions that correspond to the readable conductive image portion and provide a target for contact with the readable conductive image portion.

14. The method of claim 13, wherein the graphics layer includes a graphically displayed serial number, and wherein the readable conductive image portion comprises a corresponding serial number.

15. The method of claim 13, wherein the graphics layer and the readable conductive image portion provide different information from each other.

* * * * *